(12) United States Patent
Choudhury

(10) Patent No.: US 6,229,367 B1
(45) Date of Patent: May 8, 2001

(54) METHOD AND APPARATUS FOR GENERATING A TIME DELAYED SIGNAL WITH A MINIMUM DATA DEPENDENCY ERROR USING AN OSCILLATOR

(75) Inventor: Ashish K. Choudhury, Camarillo, CA (US)

(73) Assignee: Vitesse Semiconductor Corp., Camarillo, CA (US)

( * ) Notice: Subject to any disclaimer, the term of this patent is extended or adjusted under 35 U.S.C. 154(b) by 0 days.

(21) Appl. No.: 09/365,189

(22) Filed: Aug. 2, 1999

Related U.S. Application Data

(63) Continuation of application No. 08/884,365, filed on Jun. 27, 1997, now abandoned.

(51) Int. Cl.$^7$ ..................................... H03K 5/13
(52) U.S. Cl. .................. 327/276; 327/269; 327/270
(58) Field of Search .................. 327/276, 277, 327/261, 262, 263, 269, 270, 291, 292, 299

(56) References Cited

U.S. PATENT DOCUMENTS

| 4,604,582 | * | 8/1986 | Strekowski | 327/152 |
| 5,175,453 | * | 12/1992 | Chang | 327/276 |
| 5,237,224 | * | 8/1993 | Delisle | 327/276 |
| 5,467,040 | * | 11/1995 | Nelson | 327/276 |
| 5,561,692 | * | 10/1996 | Maitland | 327/152 |
| 5,589,788 | * | 12/1996 | Goto | 327/276 |
| 5,708,381 | * | 1/1998 | Higashisaki | 327/276 |
| 5,731,725 | * | 3/1998 | Rothenberger | 327/276 |
| 5,955,905 | * | 9/1999 | Idei et al. | 327/160 |

* cited by examiner

Primary Examiner—Tuan T. Lam
(74) Attorney, Agent, or Firm—Christie, Parker & Hale, LLP

(57) ABSTRACT

The present invention provides a time delay system that generates a selectable asynchronous time delayed signal from an incoming signal using a pulse having a minimum pulse width and stop-startable oscillator. The time delay system of the present invention produces a minimum data dependency error which is independent of the repetition rate of the incoming signal, the substrate settling time, and the length of the time delay of the delayed signal.

16 Claims, 12 Drawing Sheets

US 6,229,367 B1

METHOD AND APPARATUS FOR GENERATING A TIME DELAYED SIGNAL WITH A MINIMUM DATA DEPENDENCY ERROR USING AN OSCILLATOR

This application is a continuation of application Ser. No. 08/884,365 filed Jun. 27, 1997 now abandoned.

BACKGROUND OF THE INVENTION

1. Field of the Invention

The present invention relates to generation of intentional time delays into incoming signals.

2. Description of the Related Art

A conventional time delay system in shown in FIG. 1a. The time delay system 40 includes a series/parallel combination of buffers 12, 16, 18, 22, 24, 26, 28, 32 through 34 and multiplexers 14, 20, 30, and 36. The time delay system 40 also includes delay control bits S0–S3. Each of the buffers 12, 16, 18, 22, 24, 26, 28, 32 through 34 is a delay element that provides a time delay into its input signal. The delay control bits S0–S3 control multiplexers 14, 20, 30, and 36 so that the multiplexers select either signals or non-delayed signals. For instance if S0 is 0, then the multiplexer 14 chooses the non-delayed input signal at a node 10 rather than the input-signal delayed by the time delayed associated with the buffer 12. In operation, if the delay control bits S0–S3 are 1100, then the output signal 38 is the input signal 10 delayed by the time delay of the buffers 12, 16, and 18 and the intrinsic time delay associated with the multiplexers 14, 20, 30, and 36.

Another known approach is illustrated conceptually in FIG. 14a. This scheme provides the same functionality as the approach in FIG. 1, but it eliminates the concatenation of multiple multiplexers. A third known approach shown in FIG. 14b is to use a resistive ladder to delay the incoming signal based on an RC time constant. As the values of resistors 1041, 1043, 1045 and 1047 are increased by linear multiples of some value R, and the value C is the same for capacitors 1048, the delay step $\tau_{delta}$ produced by the ladder equals $\tau_{RC}$.

The two approaches of FIGS. 14a and 14b can be combined such that the output 1044 of the time delay system of FIG. 14a is coupled to the input node 1049 of the time-delay system of FIG. 14b, wherein the time delay system of FIG. 14a acts as a coarse vernier and the time delay system of FIG. 14b acts as a fine adjustment.

Another well-known technique is illustrated in FIG. 15a, wherein a voltage 1054 through resistor R is connected to an integrator formed by capacitor 1056 and amplifier 1058 at a known time t corresponding to the rising edge of an input signal to be delayed. The voltage at the output of the integrator is a ramping voltage which is quite linear and which has a duration equal to the delay range of the circuit. The ramp voltage is input to one input of a comparator circuit 1060. The other input of comparator 1060 is coupled to the output of a digital-to-analog converter (DAC) 1062. The DAC 1062 produces a voltage which is linearly proportional to the n-bit digital program work presented on DAC input 1064.

When the ramp voltage hits the same voltage level as that which is output by the DAC 1062, the comparator switches and produces an edge which is delayed by the amount of time it took for the ramp to reach the DAC voltage level.

One application of the conventional time delay system or the present invention is in generating deskew delays for a random access memory (RAM) tester as shown in FIG. 1b. A timing generator 46 provides test signals to the test devices such as RAM 1, RAM 2, and RAM N. The test devices RAMs 1–N are connected to the timing generator 46 through cables 1–N. Because the cables 1–N are different in length, the signals sent by the timing generator 46 arrive at the test devices RAMs 1–N at difference times. In order to have the signals arrive at the test devices RAMs 1–N at the same time, deskew delay units 1–N may be provided as shown in FIG. 1b. Each of the deskew delay units 1–N may incorporate the time delay system 40 or the present invention which is programmed to provide a time delay so that all of the test devices RAMs 1–N receive the signals from the timing generator 46 at the same time.

One problem associated with the conventional time delay systems is the data dependency error. A data dependency error is described with reference to FIG. 2. A time delay system 51 in FIG. 2 consists of four delay elements including buffers 52, 54, 56, and 58. An input signal 50a at an input node 50 has a repetition period of $T_p$. A first pulse 50b of the input signal 50a travels through the buffers 52, 54, 56, and 58, and reaches an output node 60 after a time delay Td1. A second pulse 50c of the input signal 50a reaches the output 60 after a time delay of Td2. A data dependency error is defined as Td2-Td1. Ideally, Td1 should be equal to Td2. In such a case, the data dependency error is zero. Typically, a data dependency error is not zero. As the repetition rate $T_p$ decreases, the substrate settling time increases, the data dependency error becomes worse. The substrate settling time will be described in more detail with reference to FIG. 8. In addition, as the required time delay becomes longer, the data dependency error of a delayed signal of a conventional time delay system increases. For example, to provide a long time delay, the time delay system 40 requires more buffers. As more buffers are added, the data dependency error also increases. At some point, the data dependency error may become too large to be acceptable especially for highly accurate timing systems.

Accordingly, there is a need for a time delay system that can provide a minimum data dependency error that is independent of the repetition rate of the input signal, the substrate settling time, and the length of the time delay.

SUMMARY OF THE INVENTION

The present invention provides a time delay system that generates a selectable asynchronous time delayed signal from an incoming signal using a pulse having a minimum pulse width and a stop-startable oscillator. The time delay system of the present invention produces a minimum data dependency error which is independent of the repetition rate of the incoming signal, the substrate settling time, and the length of the time delay of the delayed signal.

By stopping and re-starting the oscillator only for a short duration in response to the short pulse that has a known phase with respect to the incoming signal, the phase of the oscillator is aligned to the incoming signal, the oscillator period does not change with the repetition rate of the incoming signal, and the oscillator's substrate receives minimum perturbation. Hence, the oscillator introduces only an insignificant amount of data dependency error, and the time delay system of the present invention can generate a delayed signal having even a very long time delay.

The time delay system of the present invention may include a pulse generator for generating a short pulse in response to an input pulse, a stop-startable oscillator for generating multiple oscillating signals capable of providing multiple steps of a medium-sized time delay, where the oscillator is stopped in response to the leading edge of the short pulse and re-started in response to the trailing edge of the short pulse.

The time delay system may further include a multiplexer for selecting one of the oscillating signals, a vernier for providing multiple steps of a fine time delay, and a shift register for providing multiple steps of a coarse time delay, where a step of the medium-sized time delay is typically greater than a step of the fine time delay, and a step of the coarse time delay is typically one period of the oscillator. A total fine time delay which is a sum of all of the steps of the fine time delay is typically greater than a step of the medium-sized time delay so that there is no discontinuity from one time delay step to the next.

The time delay system may also include a pipeline unit for delivering the short pulse to the shift register at a time appropriate for the amount of time delay selected.

The oscillator may include multiple OR gates connected in series and connected to the pulse generator, where the last OR gate in the series is connected to the first OR gate in the series.

BRIEF DESCRIPTION OF THE DRAWINGS

FIG. 15b illustrates the signals found on the nodes of the time delay system of FIG. 15a during its operation.

DETAILED DESCRIPTION OF THE INVENTION

The present invention provides a time delay system that generates a selectable asynchronous time delay signal with a minimum data dependency error that is independent of the repetition rate of an input signal, the substrate settling time, and the length of the time delay of the delayed signal. In the following detailed description, numerous specific details are set forth to provide a full understanding of the present invention. It will be obvious, however, to one skilled in the art that the present invention may be practiced without some of these specific details. In other instances, well-known circuits, structures, and techniques have not been shown in detail not to unnecessary obscure the present invention.

Figure 3:
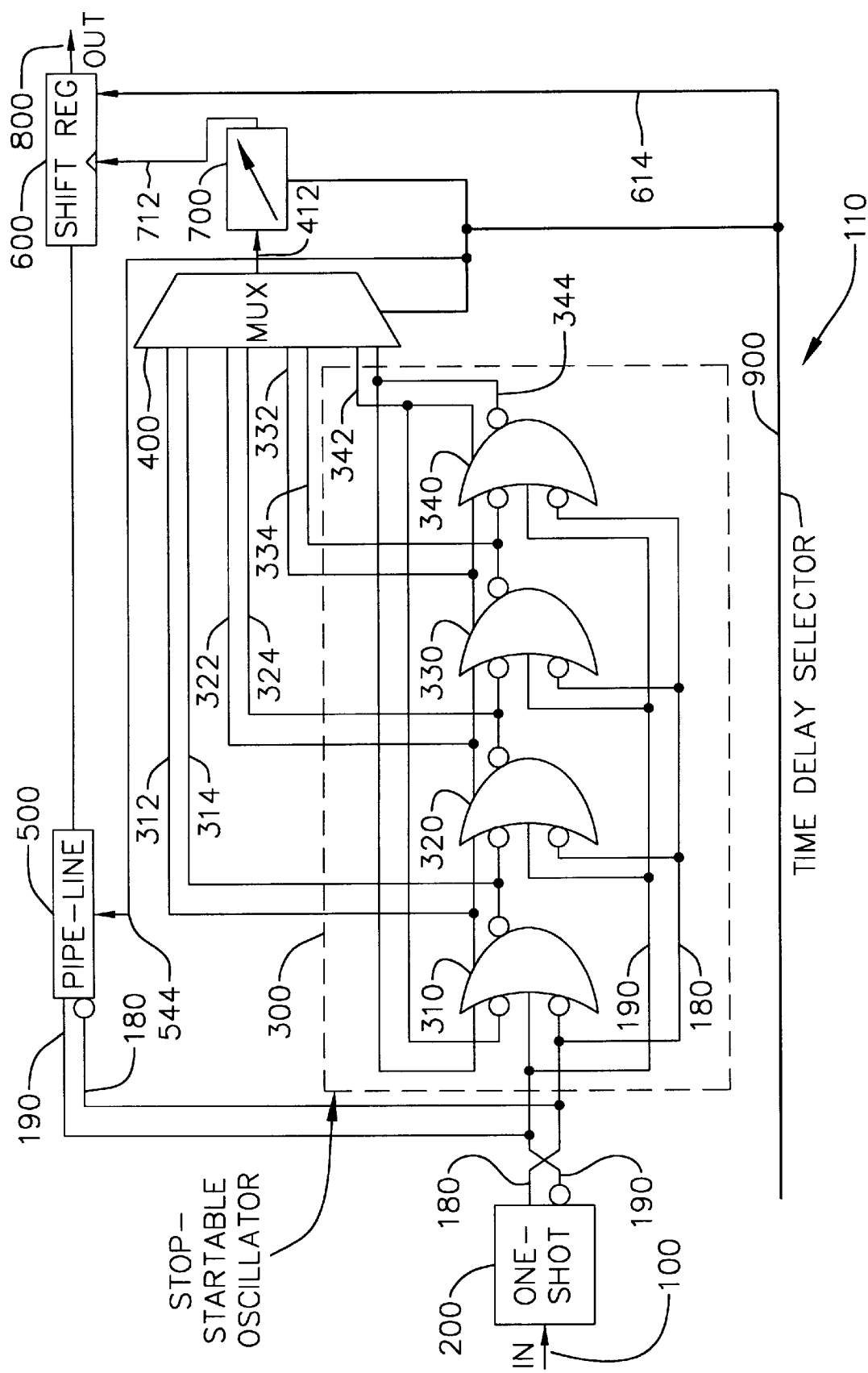
FIG. 3 is a time delay system according to the present invention.

Now referring to FIG. 3, a time delay system of the present invention according to one embodiment is presented. A time delay system 110 in FIG. 3 includes a pulse generator such as a one-shot unit 200, a stop-startable oscillator 300 which can be used as a time delay generator, a phase selector such as a multiplexer 400, a fine time delay generator such as a vernier 700, a pipeline unit 500, and a coarse time delay generator such as a shift register 600. A time delay selector line 900 provides control signals to the multiplexer 400, the vernier 700, the pipeline unit 500, and the shift register 600.

The one-shot unit 200 generates a pulse in response to an input signal provided at an input node 100. The oscillator 300 generates one or more oscillating signals that run at all times. The oscillating signals are stopped and re-started only in response to a pulse appearing at the input of the oscillator 300. In FIG. 3, such a pulse is the pulse generated by the one-shot unit 200. The multiplexer 400 selects one of the oscillating signals generated by the oscillator 300 that corresponds to a medium time delay amount specified by the time delay selector line 900. The vernier 700 delays the selected oscillating signal by a fine time delay amount specified by the time delay selector line 900. The pipeline unit 500 allows the pulse generated by the one-shot unit 200 to arrive at the input of the shift register 600 at a time appropriate for the amount of time delay specified by the time delay selector line 900. The shift register 600 receives the output of the pipeline 500, delays it by a coarse time delay amount specified by the time delay selector line 900 and passes it to an output node 800 as an output signal.

An input signal enters the time delay system 110 at an input node 100, and a delayed output signal is generated at an output node 800 after a total selected time delay specified by the time delay selector line 900 plus an intrinsic time delay associated with various components of the time delay system 110. The time delay selector line 900 contains multiple bits specifying the amount of the medium time delay, fine time delay, and coarse time delay. AS discussed above, the medium time delay is produced by the oscillator 300, the fine time delay is produced by the vernier 700, and the coarse time delay is produced by the shift register 600.

The total selected time delay of an output signal is selectable because the oscillator 300, vernier 700, and shift register 600 provide a range of time delays, and the time delay selector line 900 specifies the amount of the time delay to be selected. The total selected time delay of the system 110 is also asynchronous because there is no clock signal associated with the input signal of the time delay system 100.

Figure 1A:
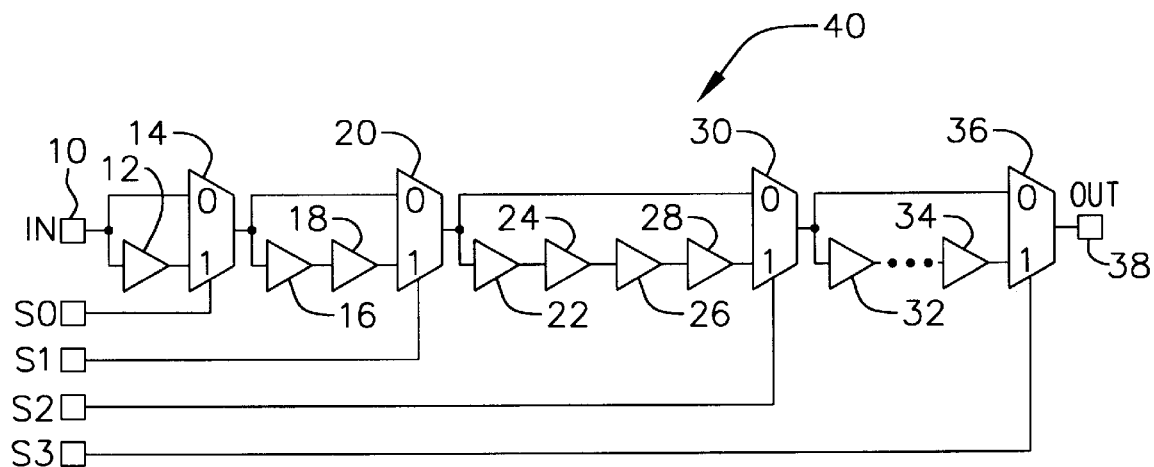
FIG. 1a is a prior art time delay system.
Figure 1B:
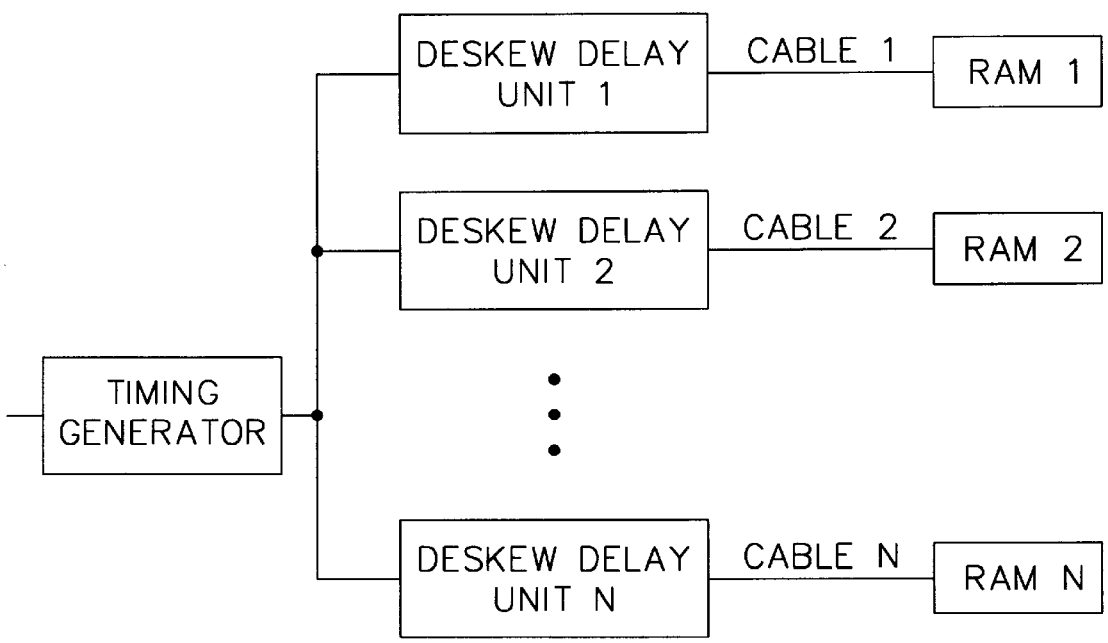
FIG. 1b illustrates an automated circuit test system in which the present invention and other prior art time delay systems are typically applied.
Figure 2:
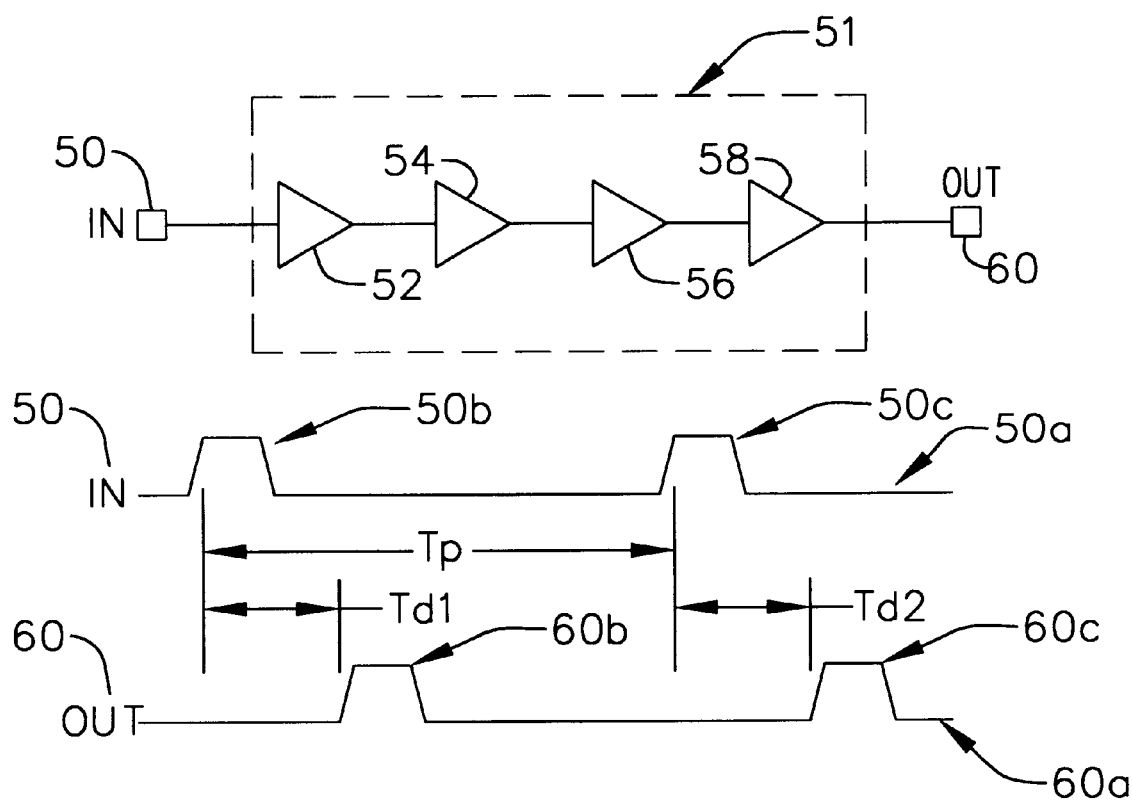
FIG. 2 illustrates how a data dependency error is introduced into a time delay system.

In addition, the data dependency error of an output signal is independent of the total selected time delay of the output signal. The data dependency error is approximately (a) 1–2% of the width of the pulse generated by the one-shot unit 200 plus (b) 1–2% of the time delay between a clock signal arriving at a flip-flop in the shift register 600 and the output signal generated by the flip-flop. For example, regardless of whether a total selected time delay is in the order of micro-seconds or milli-seconds, if the width of the pulse generated by the one-shot 200 is 500 pS, and the time delay between a clock input and Q output of a flip-flop in the shift register 600 is 300 pS, then the data dependency error is only approximately 8–16 pico-seconds (pS). A conventional time delay system such as the one in FIG. 1a can not provide a total selected time delay in the order of milli-seconds because the data dependency error of such a system would be too large. Furthermore, the data dependency error of an output signal of the time delay system 110 is independent of the repetition rate of its input signal and the substrate settling time, as described later in more detail.

Figure 4:
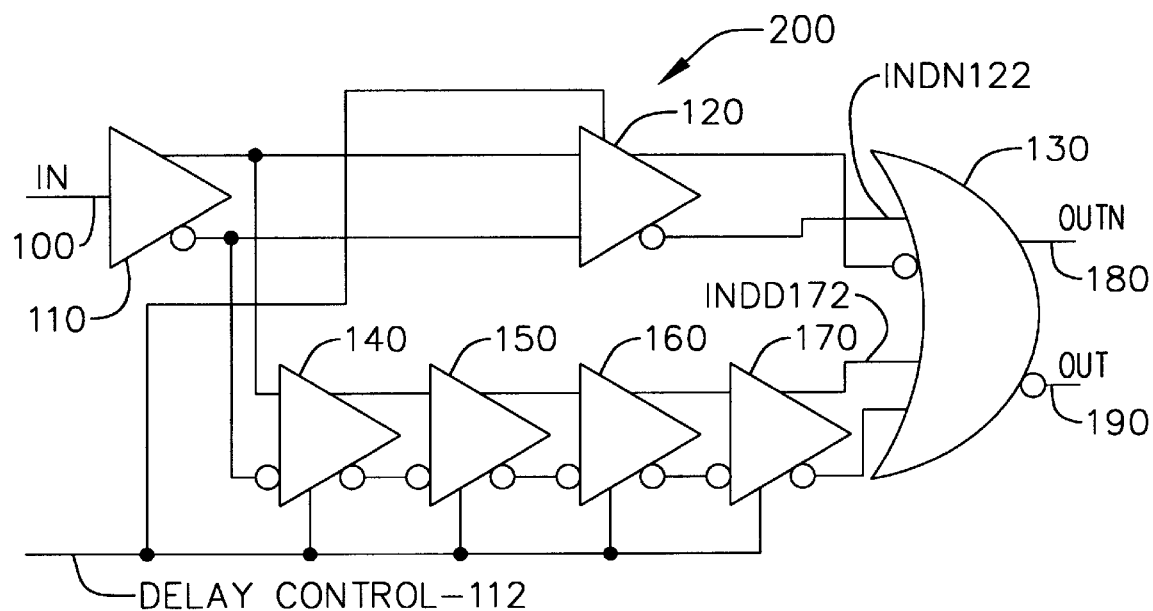
FIG. 4 is one implementation of the one-shot unit in FIG. 4 in accordance with one embodiment of the present invention.

FIG. 4 is one implementation of the one-shot unit 200 in FIG. 3 in accordance with one embodiment of the present invention. The one-shot unit 200 includes buffers 110, 120, 140, 150, 160, and 170 and a NOR gate 130. Each of the buffers 110, 120, 140, 150, 160, and 170 has its associated time delay. When an input signal at the input node 100 passes through the buffers 110 and 120, the output signal of the buffer 120 is the input signal delayed by the time delay associated with the buffers 110 and 120. When an input signal passes through the buffers 110, 140, 150, 160, and 170, the output signal of the buffer 170 is the input signal delayed by the time delay associated with the buffers 110, 140, 150, 160, and 170. The amount of the time delay can be controlled by adding more buffers or eliminating some of the buffers. Alternatively, a delay control 112 which produces an analog voltage can control the time delays of the buffers 120, 140, 150, 160, and 170. The delay control 112 can be provided by an external circuit or an internal circuit.

Figure 5:
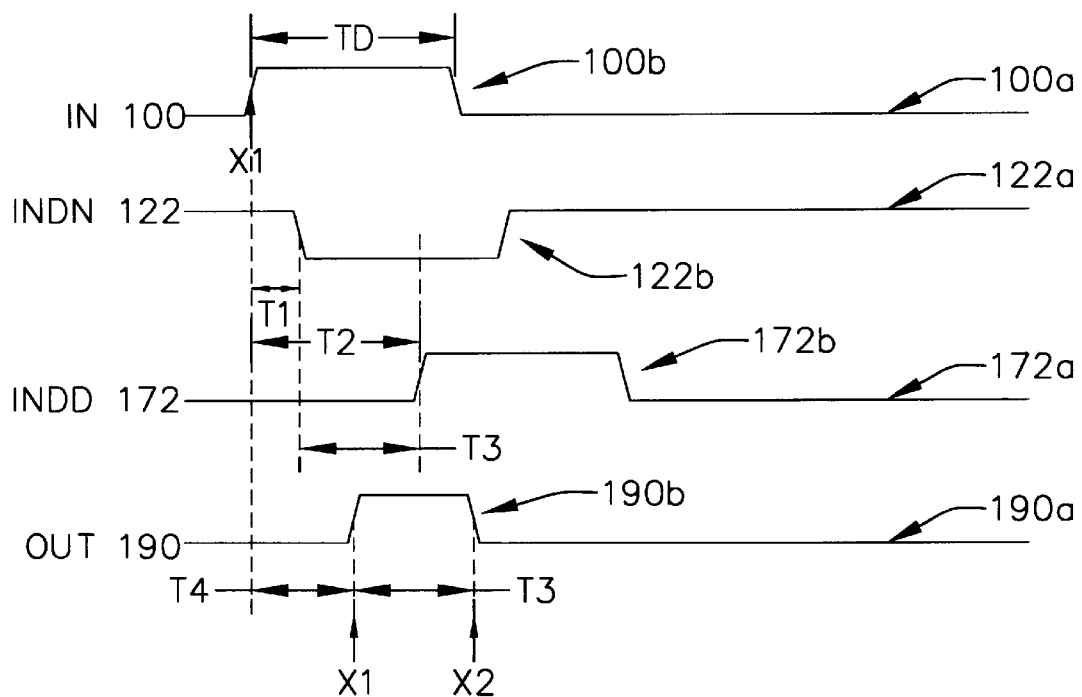
FIG. 5 illustrates a timing diagram representing the waveforms at various nodes in FIG. 4.

The operation of the one-shot unit 200 is described with reference to FIGS. 4 and 5. An input signal 100a at the input node 100 having a pulse width T0 produces at a node INDN 122 an inverted signal 122a of the input signal 100a delayed by a time delay period of T1. T1 is the time delay associated with the buffers 110 and 120. The signal 172a that appears at a node INDD 172 is the input signal 100a delayed by a time delay period of T2. T2 is a time delay associated with the buffers 110, 140, 150, 160, and 170. An output signal 190a that appears at an output node 190 includes a pulse 190b delayed by a time delay period of T4 and having a pulse width T3. T4 is the sum of T1 and the intrinsic time delay of the NOR gate 130. T4 is fixed for a particular temperature and voltage. The output signal 190a at the output node 190 is a logic high only when both the signals at nodes INDN 122 and INDD 172 are at a logic low.

Typically, the output signal at the output node 190 is a delayed signal of the input signal at the input node 100, and the width of the pulse of the output signal is typically smaller than the width of the pulse of the input signal. Optimally, the pulse width T3 of the output signal at the output node 190 should be minimized to reduce the data dependency error of the output signal at the output node 800 in FIG. 3. However, the pulse width T3 needs to be large enough so that the pulse can properly propagate through the pipeline 500 and the shift register 600 in FIG. 3. When T0 is 2–3 nS, a typical number for T3 is 500 pS. It should be noted that if the width of an input pulse of an input signal at the input node 100 is small (e.g., 500 pS), then the input pulse itself can be used to stop and re-start the oscillator 300. In such a case, the leading edge of the input pulse stops the oscillator 300, and the trailing edge of the input pulse restarts the oscillator 300.

The structure and operation of the oscillator 300 is described in detail with reference to FIGS. 3, 6, 7, and 8. FIG. 3 shows one implementation of the oscillator 300 according to one embodiment of the present invention. The oscillator 300 includes one or more OR gates connected in series and connected to the one-shot unit 200 where the last one in the series is connected to the first one in the series. In this example, the oscillator 300 includes four gates, 310, 320, 330, and 340. However, the oscillator 300 may incorporate more or less OR gates.

Figure 6:
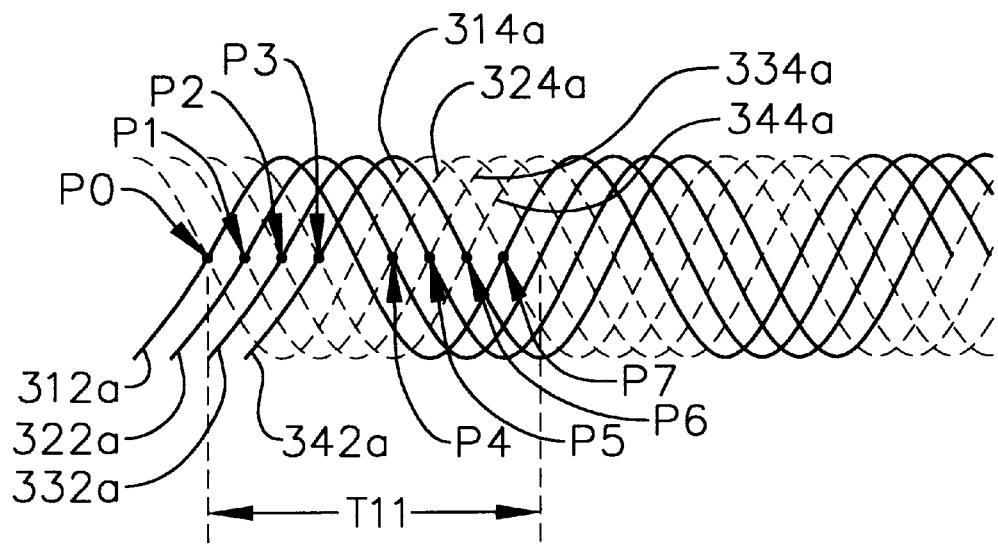
FIG. 6 illustrates the signals seen at various output nodes of the oscillator in FIG. 3.

FIG. 6 shows eight oscillating signals 312a, 322a, 332a, 342a, 314a, 324a, 334a, and 342a generated by the oscillator 300 at nodes 312, 322, 332, 342, 314, 324, 334, and 342, respectively. By generating eight oscillating signals, the oscillator 300 provides eight selectable consecutive phases that correspond to eight steps of the medium time delay (P0–P7). These delays are medium-sized compared to the delays generated by the vernier 700 or the shift register 600. A typical step size of a medium time delay may be 125 pS. In such a case, one period (T11) of the oscillator 300 in 1 nS.

Figure 7:
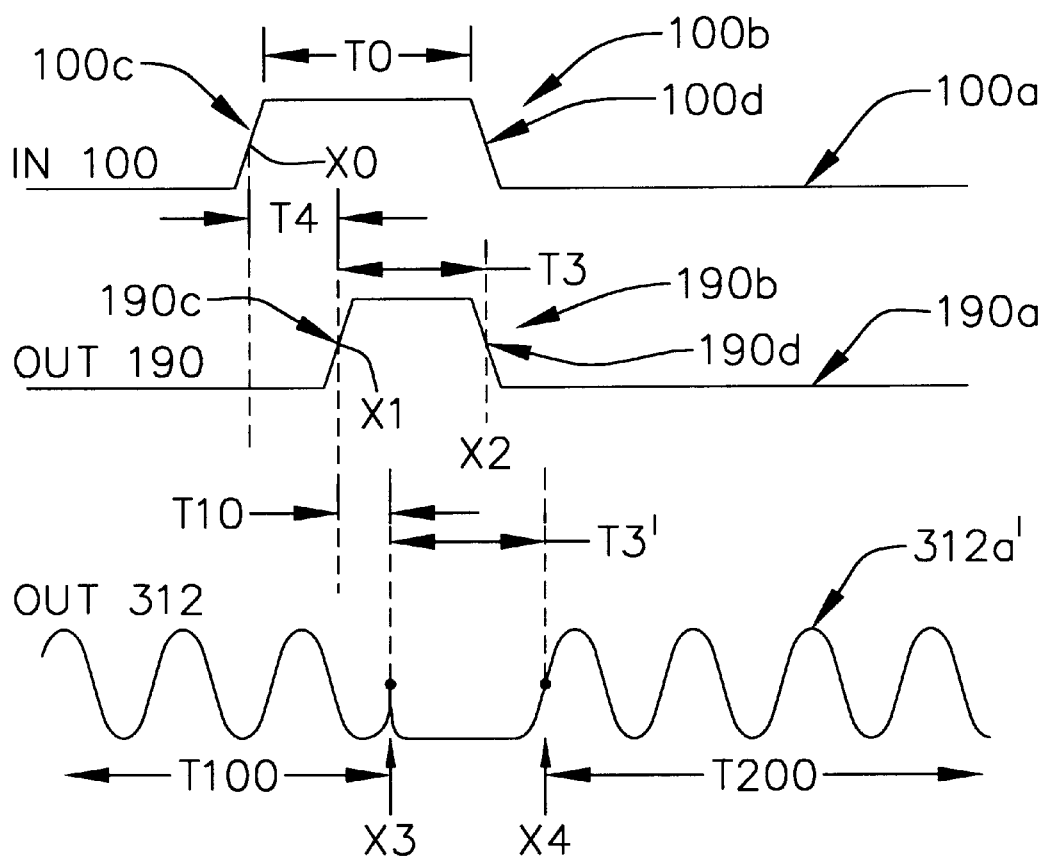
FIG. 7 illustrates a timing diagram of the waveforms at nodes 100, 190, and 312 in FIG. 3.

Now referring to FIGS. 3 and 7, the stop and re-start operation of the oscillator 300 is described. When an input signal 100a having a pulse 100b with a pulse width of T0 is presented at the input node 100, the one-shot unit 200 generates a delayed pulse 190b at the output node 190 having a time delay T4 and a pulse width of T3. For a given temperature, voltage, and circuit design structure of the one-shot unit 200, the periods T4 and T3 are fixed with respect to the input pulse 100b. Hence, the points X1 and X2 are constant with respect to X0.

The pulse 190b stops and re-starts the oscillator 300. FIG. 7 shows an oscillating signal 312a' at the node 312 that is stopped and re-started by the pulse 190b. During a period T100 (i.e., before encountering the pulse 190b), the phase of the oscillating signal 312a' has no particular relation to the pulse 190b. However, when the oscillator 300 encounters a leading edge 190c of the pulse 190b, the oscillating signal 312a' stops at a point X3 which occurs after a time delay period of T10. T10 is the time delay associated with the gate 312 and is fixed for a given temperature and voltage. Hence, the oscillating signal 312a' is stopped at a phase fixed with respect to the leading edge 190c and the leading edge 100c of the input pulse 100b since both T4 and T10 are fixed for a given temperature and voltage. It should be noted that the leading edge 190c may be a rising or falling edge.

The oscillating signal 312a' remains stopped for a period of T3' and re-starts at a point X4 when is encounters a trailing edge 190d of the pulse 190b. It should be again noted that the trailing edge 190d may be a rising or falling edge. For the oscillating signal 312a' to introduce only an insignificant amount of data dependency error (e.g., less than 5 pS), X4 should be constant with respect to X0. To accomplish this, T3 should be small enough (much smaller than the substrate setting time) so that the stopping and re-starting operation of the oscillator 300 causes minimum substrate perturbation. A typical number for T3 is 500 pS.

Figure 8:
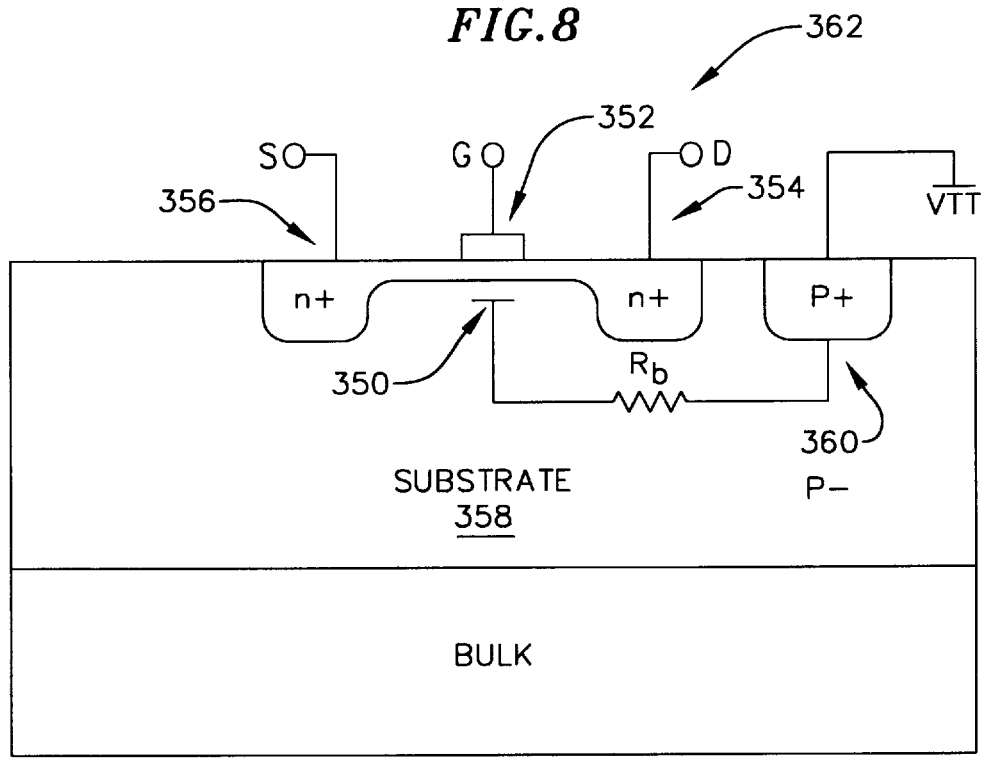
FIG. 8 is a cross-section of a MESFET.

The substrate settling time and substrate perturbation are described with reference to FIG. 8. While the oscillator 300 in FIG. 3 may be designed using various types of circuits, it uses MESFETs according to one embodiment of the present invention. FIG. 8 is a cross-section of such a MESFET. A MESFET circuit 362 includes a gate 352, a drain 354, a source 356, and a substrate 358. While the voltage at a location 360 may be at VTT, the voltage at a location 350 under the gate 352 does not necessarily reach VTT because of the substrate resistance Rb. A substrate settling time is the amount of time required for the voltage at the location 350 to reach VTT. The substrate setting time depends on the value of Rb. If the period T3 in FIG. 7 is much smaller than the substrate settling time, then while the oscillator 300 is stopped for the period of T3', the voltage at the location 350 will not change significantly, resulting in minimum substrate perturbation. Accordingly, the oscillator 300 will be stopped only for the period of T3 (i.e., T3' will be equal to T3).

Referring back to FIG. 7, after the time period of T3', the oscillating signal 312a' re-starts at a point X4. X4 is fixed with respect to X1 and X0 because T4, T10, T3, and T3' are constant for a given temperature and voltage. Hence, the oscillating signal 312a' re-starts at a phase known with respect to the leading edge 190c of the pulse 190b of the one-shot unit 200 and the leading edge 10c of the input pulse 100b. During a period T200, the phase of the oscillating signal 312a' is thus aligned to the input pulse 100b. Furthermore, because the substrate of the oscillator 300 undergoes minimum perturbation, as explained earlier, the oscillator period (i.e., T11 in FIG. 6) does not change with the repetition rate of an input signal at the node 100 in FIG. 3. Thus, the oscillating signal 312a' introduces only an insignificant amount of data dependency error into the output signal at the output node 800 in FIG. 3.

The above discussion made with reference to FIGS. 3, 6, 7, and 8 applies to all the other oscillating signals of the oscillator 300 (i.e., the oscillating signals at nodes 322, 332, 342, 314, 324, 334, and 342) except that the period of T3' will be greater by the amount of their associated steps of the medium time delay, as described later with reference to FIG. 13. The present invention uses these oscillating signals whose phases are aligned to the input pulse 100b and whose period is constant irrespective of the repetition rate of the input signal 100a to generate the desired long time delay for the output signal at the node 800. Hence, the data dependency error of the output signal at the node 800 is independent of the input signal, the substrate settling time, and the length of the time delay.

Figure 9:
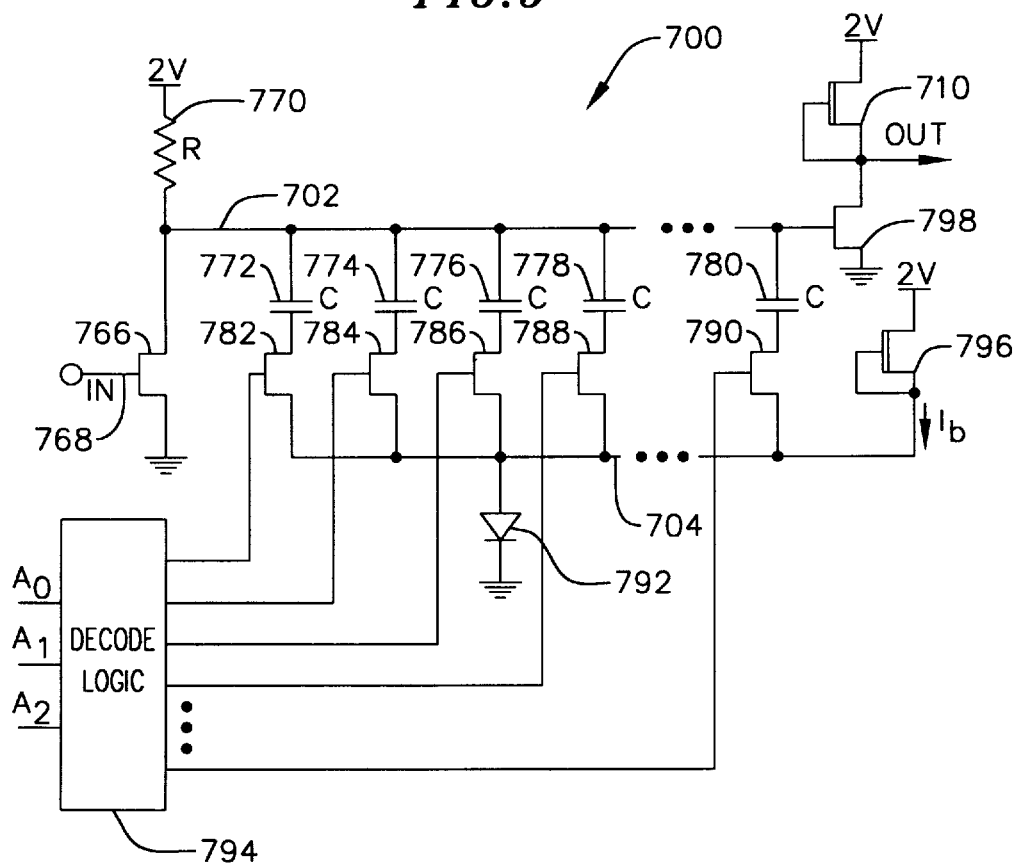
FIG. 9 illustrates the vernier in accordance with one embodiment of the present invention.

Now referring to FIG. 9, the vernier 700 in FIG. 3 is described in detail. The vernier 700 includes an input inverter, made up of an enhancement mode MESFET transistor 766 and pull-up resistor 770, the input 768 of which is coupled to a signal into which a fine time delay is to be introduced. The preferred value of the pull-up resistor 770 is 3000 ohms to 6000 ohms.

The output node 702 of the input inverter is coupled to preferably seven incremental capacitors (only five are shown) 772, 774, 776, 778, and 780. Those of skill in the art will recognize that the number of capacitors in this embodiment was chosen for convenience and that more or less capacitors could be included which would simply increase decrease respectively the programmable delay range of the element. Each of the incremental capacitors are specified to have the identical capacitance value. The preferred value of each of the capacitors is 20 FF to 40 FF.

Each of the incremental capacitors is coupled to the anode of a diode 792 through its own enhancement mode MESFET switch 782, 784, 786, 788, and 790. The control input of each of the switches is coupled to one of seven control lines generated by a decode logic 794. These control lines produce a logic level dependent on the value of a three bit program work $A_0$, $A_1$ and $A_2$. The node 702 is then coupled to the input of an output inverter including an enhancement mode MESFET 798 and depletion mode MESFET 710.

The decode logic 794 is designed to select none of the switches when $A_2=0$, $A_1=0$ and $A_0=0$ (i.e., when the control work is 000), selects one of the switches when the control work is 001, selects two of the switches when the control word is 010, and so forth, selecting all seven switches when the control word is 111.

When all of the switches are unselected (i.e., the control work is 000), the gate-to-source-voltages (i.e., $V_{GS}$) of each of the switches is ~–6 volts due to the forward biased diode 792, and the logic low is presented on each of the control lines coupled to the gates of the switches. The diode 792 is ensured to be forward biased by supplying a small bias current $I_b$ from a current source. In this embodiment, this current source is implemented by a depletion mode MESFET 796. Under this condition, none of the incremental capacitors are effectively seen at the node 702. The only capacitance seen at the node 702 is the parasitic capacitance (i.e., $C_p$) associated with the circuit. Thus, an input signal at input 768 will be inverted at the node 702 and will experience a time delay due to a time constant $\tau=RC_p$. This time delay is therefore the time delay of the vernier 700.

When the control is 001, one of the control lines will transmit a logic high voltage to the gate of one of the switches, thereby closing the switch and coupling its capacitor to ground through the diode 792. This capacitor is now effectively seen at the node 702. An input signal at the input 768 will be inverted at the node 702 and will experience a time delay due to a time constant $\tau=R(C_p+C)$. Likewise, when the control word is 010, two of the switches will be closed under control of the decode logic 794 and thus two of the incremental capacitors will be effectively seen at the node 702. An input signal will then be delayed by a time constant $\tau=R(C_p+2C)$. When the control word is 111, all of the incremental capacitors will be seen at the node 702, and an input signal will be inverted at the node 702 and the inverted signal will be delayed by a time constant $\tau=R(C_p+7C)$.

Figure 10:
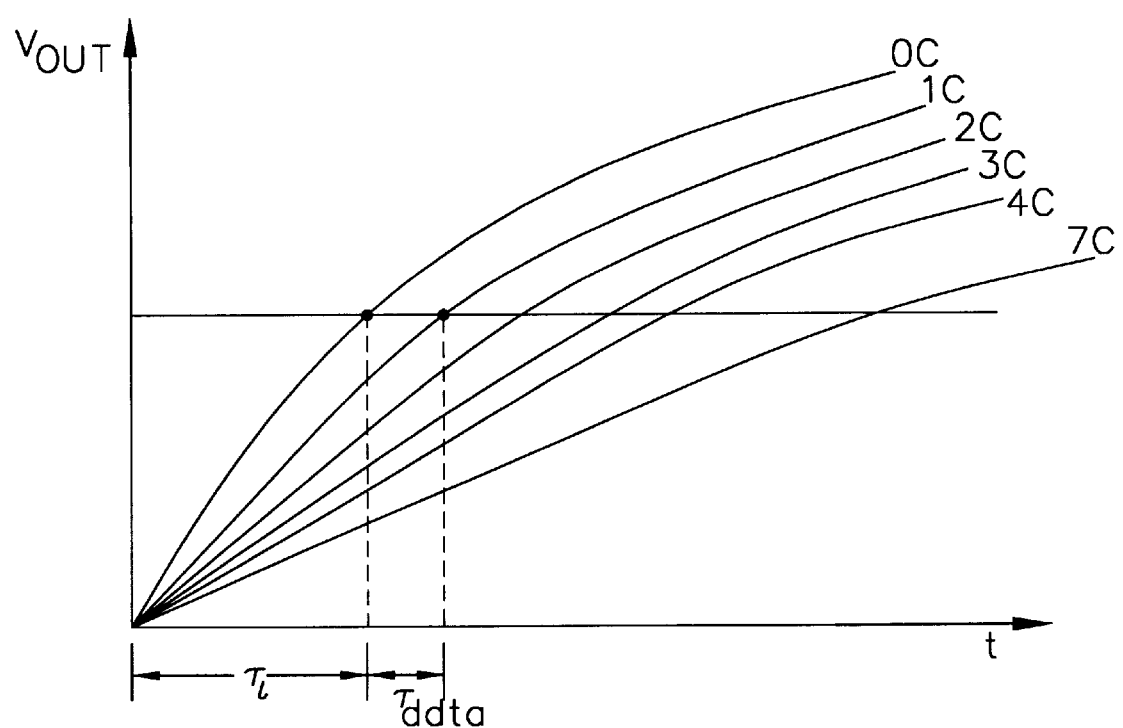
FIG. 10 illustrates the waveforms seen at the input of the inverter of the vernier for various input codes.

An example of the possible waveforms seen on the node 702 of the vernier 700 is illustrated in FIG. 10. The waveforms illustrate the step delay for the control words of the vernier 700 as the difference in the time at which the input signal crosses the switch point of the input inverter to the time at which the signal seen on the node 702 crosses the switch point of the output inverter. The intrinsic delay of the vernier 700 is denoted as $\tau_i$. the incremental or step delay $\tau_{delta}$ is the difference in time between the points at which the delayed signals generated using numerically adjacent control words cross the switch point of the output inverter.

It is because the values of resistors and capacitors can be controlled with much greater predictability well over process variations than can the output characteristics of active devices that the vernier 700 can produce a $\tau_{delta}$ in the 10 to 20 picosecond range with relatively little variation between circuits on the same wafer, between circuits on different wafers in the same lot, and even between chips from wafers from one lot to another. Moreover, no active devices are used anywhere in the circuit that will significantly affect the delay path, such as multiplexers. Thus, the vernier 700 will not require expensive and tedious calibration.

Those of skill in the art will recognize that numerous verniers can be concatenated in series to increase the desired programmable delay range. It will also be recognized that the values of the resistor 770 and the incremental capacitors 772, 774, 776, 778, and 780 can be varied to achieve various design objectives. It will be further recognized that resistor 770 could be implemented with an active device, although the resistor is preferred because its value can be more readily controlled and predicted. Finally, although the embodiment shown in FIG. 10 is designed using FET logic for manufacture using a gallium arsenide semiconductor process, a vernier could be implemented in other processing technologies using other types of logic which permit the use of switched capacitors.

Figure 11:
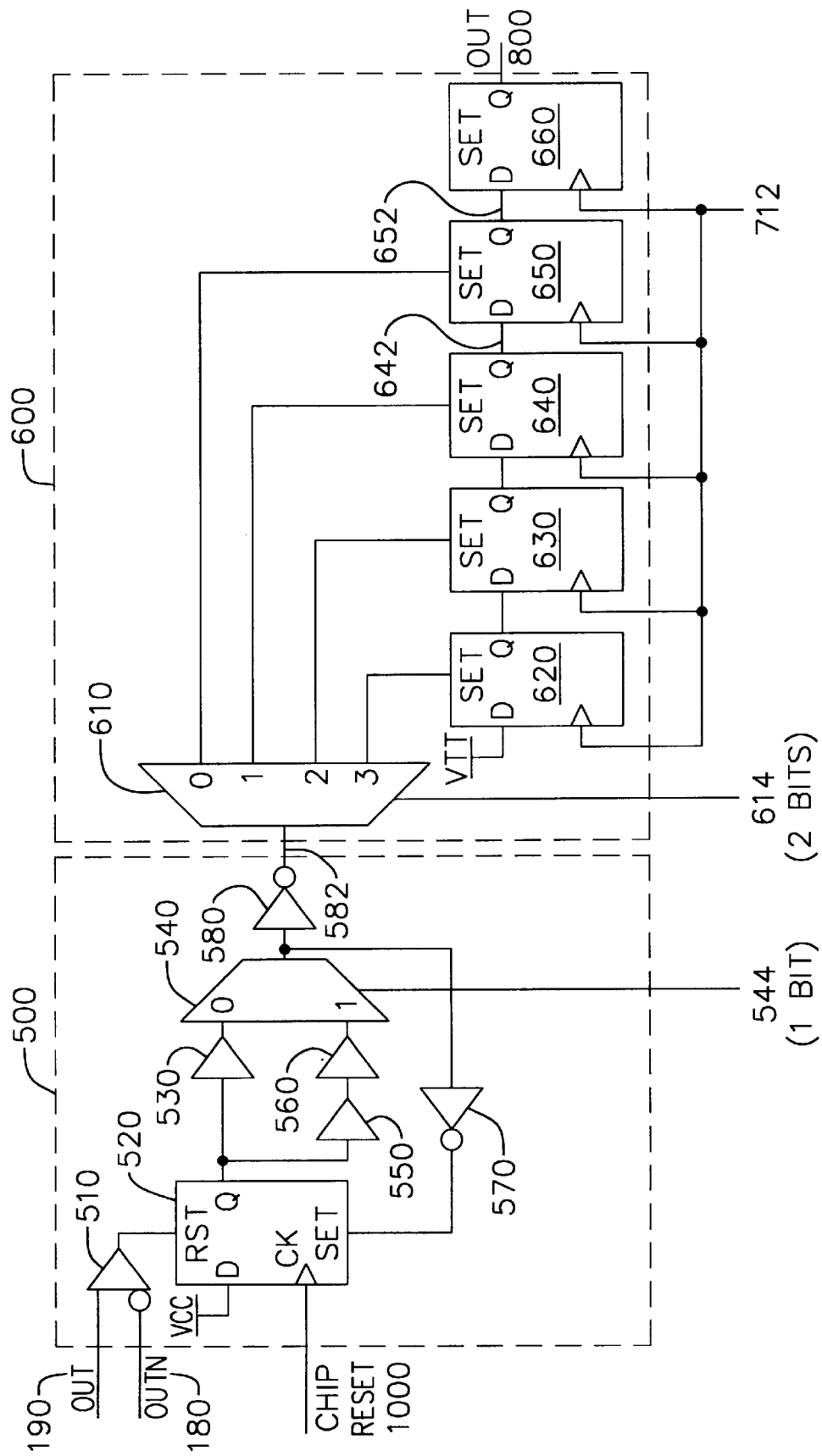
FIG. 11 is one implementation of the pipeline and the shift register shown in FIG. 3 in accordance with one embodiment of the present invention.

Now referring to FIG. 11, the pipeline unit 500 and shift register 600 in FIG. 3 are described in detail according to one embodiment of the present invention. The pipeline unit 500 includes a flip-flop 520, buffers 510, 530, 550, and 560, a multiplexer 540, and inverters 570 and 580. The D input of the flip-flop 520 is connected to VCC, the clock of the flip-flop 520 is connected to a chip RESET 1000, and the RESET (RST) of the flip-flop 520 is coupled to the output nodes 180 and 190 of the one-shot unit 200 through the buffer 510.

In operation, the output signal of the flip-flop 520 is a logic high until the RST of the flip-flop 520 resets the flip-flop 520. In other words, when the output signal of the buffer 510, which is the output signal 190a of the one-shot unit 200 delayed by the time delay of the buffer 510, introduces the pulse 190b from the one-shot unit 200, the output signal of the flip-flop 520 goes low. This output signal passes through the buffer 530 and the buffers 550 and 560 in parallel.

The multiplexer 540 chooses either the output of the buffer 530 or buffer 560 depending on the value of the control bit from a line 544 provided by the time delay selector line 900 in FIG. 3. Whether the control bit is 0 or 1 depends on which phase of the oscillator 300 in FIG. 3 (i.e., the number of steps of the medium time delay) is selected. In accordance with the embodiments shown in FIGS. 3, 6, and 11, when one of the phases P0–P3 is selected, the control bit of the line 544 is 0. When one of the phases P4–P7 is selected, the control bit of the line 544 is 1. If the control bit is 0, then the multiplexer 540 chooses the output of the buffer 530. If the control bit is 1, then the multiplexer 540 chooses the output of the buffer 560. It should be noted that there may be a greater or less number of parallel signal paths between the flip-flop 520 and multiplexer 540 (in the current embodiment, there are two parallel paths), and there may be more control bits for the line 544 and more selections for the multiplexer 540.

Figure 12:
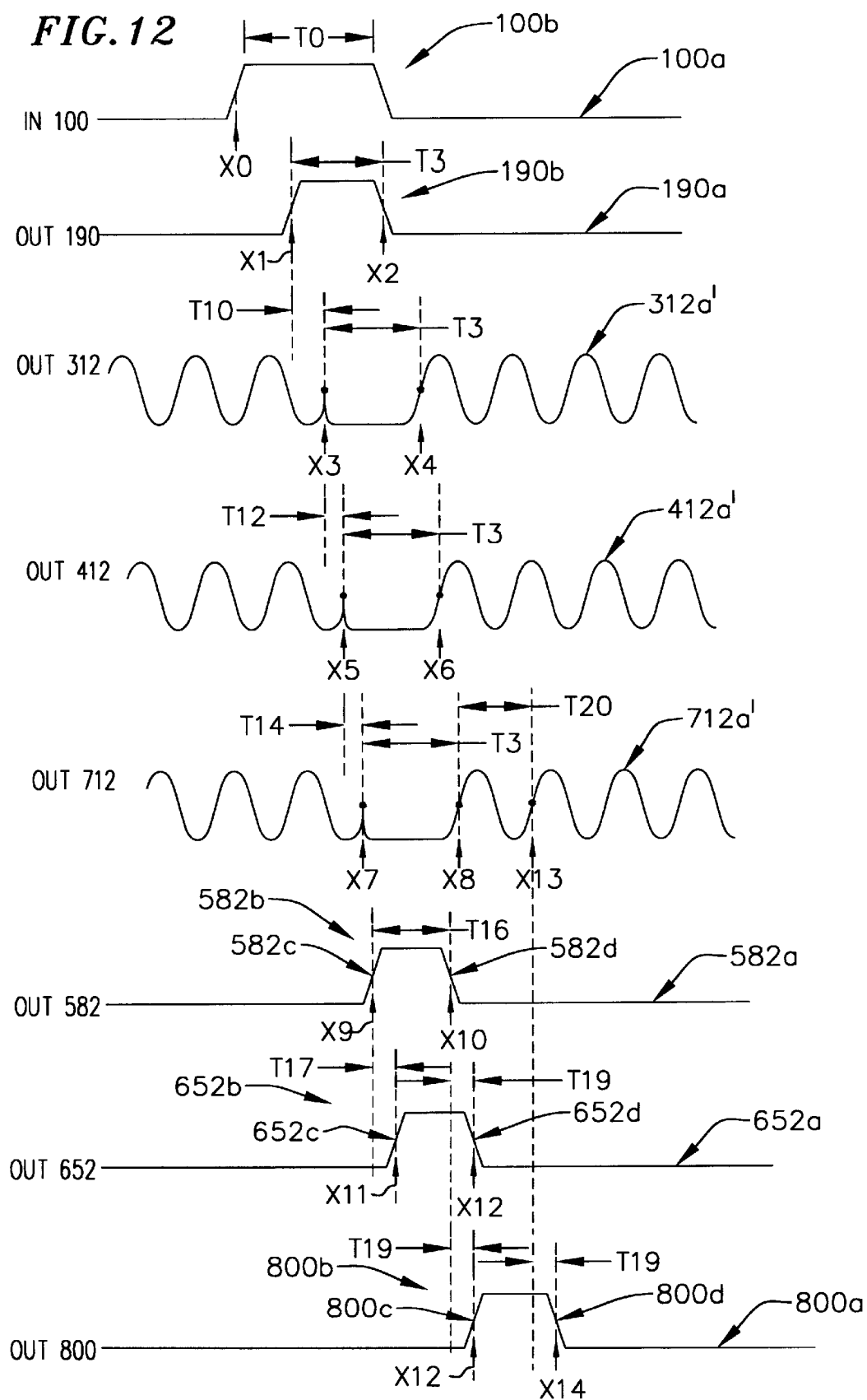
FIG. 12 illustrates a timing diagram of the waveforms as seen at various nodes in FIGS. 3 and 11.

The output signal of the multiplexer 540 is fed back to an inverter 570 whose output sets the flip-flop 520. Thus, a pulse at a node 582 is developed in response to the output pulse of the one-shot unit 200, and the width of the pulse at the node 582 is the time delay associated with (a) either the buffer 530 or the buffers 550 and 560, (b) the multiplexer 540, and (c) the inverter 570, plus the time delay between the SET input and Q output of the flip-flop 520. An example of an output signal at the node 582 is shown in FIG. 12.

Still referring to FIG. 11, the shift register 600 is described in more detail. The shift register 600 includes a de-multiplexer 610 and multiple flip-flops 620, 630, 640, 650, and 660 in series. While the SET inputs of the flip-flops 620, 630, 640, and 650 are connected directly to the de-multiplexer 610, the SET input of the last flip-flop 660 is not connected to the de-multiplexer. The clock signal line 712 is the output line of the vernier 700. The control line 614 provides two control bits from the time delay selector line 900 in FIG. 3 to control the de-multiplexer 610.

in operation, the shift register 600 provides a coarse time delay into its input signal. The output pulse of the pipeline 500 sets a flip-flop selected by the control bits of the line 614. If the pulse sets the flip-flop 650, then the output signal at a node 652 is passed to the output node 800 after one clock cycle of the flip-flops. If it sets the flip-flop 620, then the output signal at a node 620 is passed to the output node 800 after four clock cycles of the flip-flops.

For example, if the time delay selector line 900 in FIG. 3 specifies a zero step of the coarse time delay, then the control bits of the line 614 is 00, the flip-flop 650 is selected, and the output pulse of the pipeline 500 sets the flip-flop 650 which is set until the arrival of the next clock from the clock signal line 712. During the next clock cycle, the output signal of the flip-flop 650 is passed to the output node 800.

A total selected time delay of the output signal at the node 800 is the sum of the amount of the medium time delay provided by the oscillator 300, the fine time delay provided by the vernier 700, and the coarse time delay provided by the shift register 600. A step of the medium time delay can be between zero and one half period of the oscillator depending on the number of the OR gates in FIG. 3. A step of the fine time delay can be equal to or less than a step of the medium time delay. A step of the coarse time delay can be zero or equal to one period of the oscillator. A sum of all of the steps of the fine time delay is typically greater than a step of the medium time delay so that there is no discontinuity from one time delay step to the next.

In the embodiment shown in FIG. 11, one step of the coarse time delay is one clock cycle of the flip-flops, which is one period of the oscillator 300. For example, when the period of the oscillator 300 is 1 nS, each step of the coarse time delay is also 1 nS. The clock at the clock signal line 712 is generated by the oscillator 300 and vernier 700. Hence, the clock is delayed according to the amount of the medium and fine time delays produced by the oscillator 300 and vernier 700. In this example, since the amount of the coarse time delay is zero, the total selected time delay of the output signal at the node 800 is just the sum of the amount of the medium and fine time delays.

As another example, if the selected time delay is two steps of the coarse time delay, then the control bits of the line 614 is 10, the flip-flop 630 is selected, and the output pulse of the pipeline 500 sets the flip-flop 630 which is set until the arrival of the next clock from the clock signal line 712. After three clock cycles, the output signal of the flip-flop 630 is passed to the output node 800. In this case, the total selected time delay of the output signal is two steps of the coarse time delay plus the sum of the amount of the medium and fine time delays.

It should be noted that while FIG. 9 shows five flip-flops, the shift register 600 may include more or less flip-flops depending on the desired range of the coarse time delay.

Figure 13:
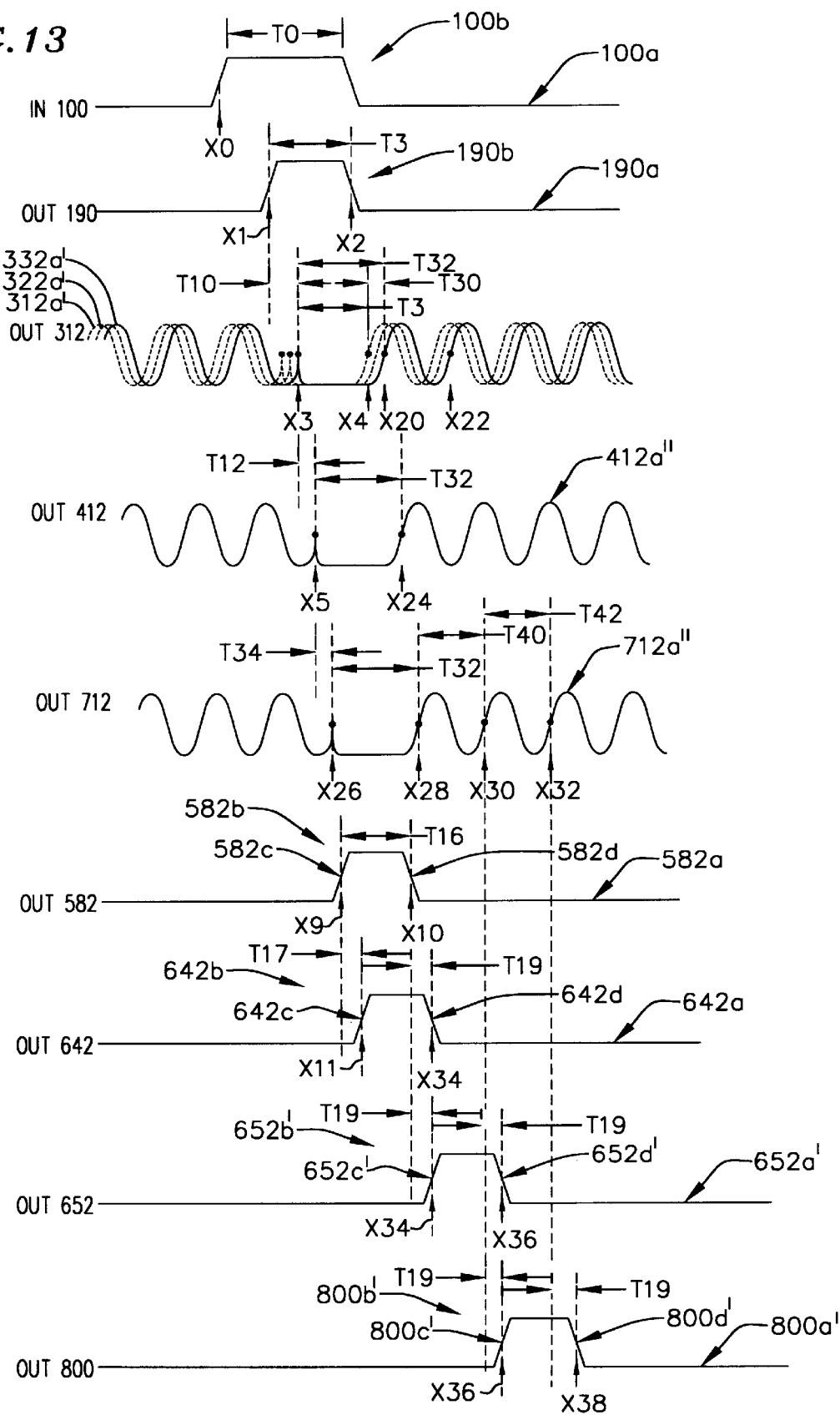
FIG. 13 illustrates another timing diagram of the waveforms as seen at various nodes in FIGS. 3 and 11.
Figure 14A:
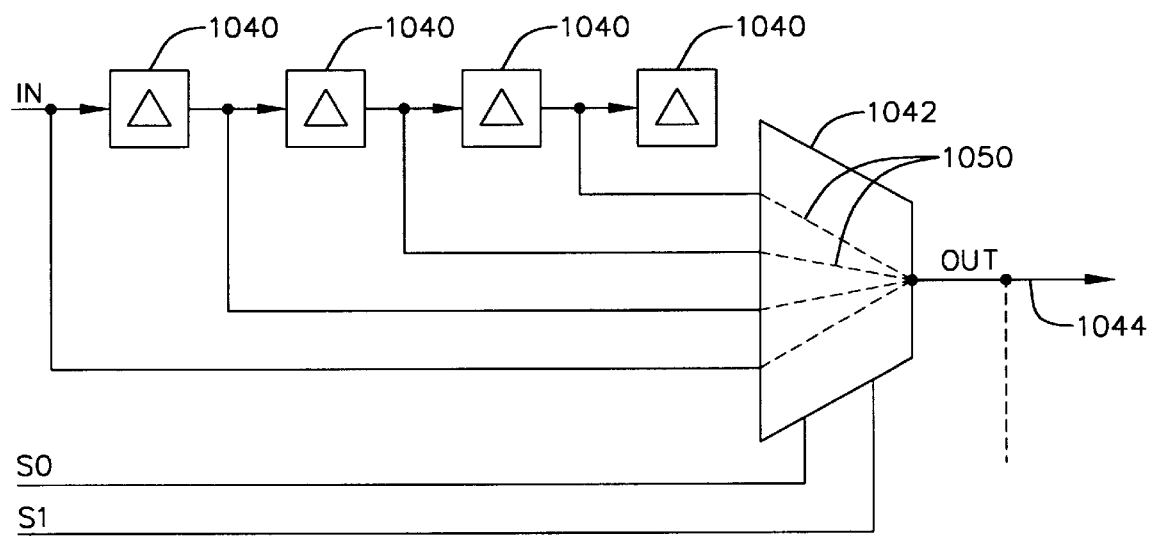
FIG. 14a is a second prior art implementation of a time delay system.
Figure 14B:
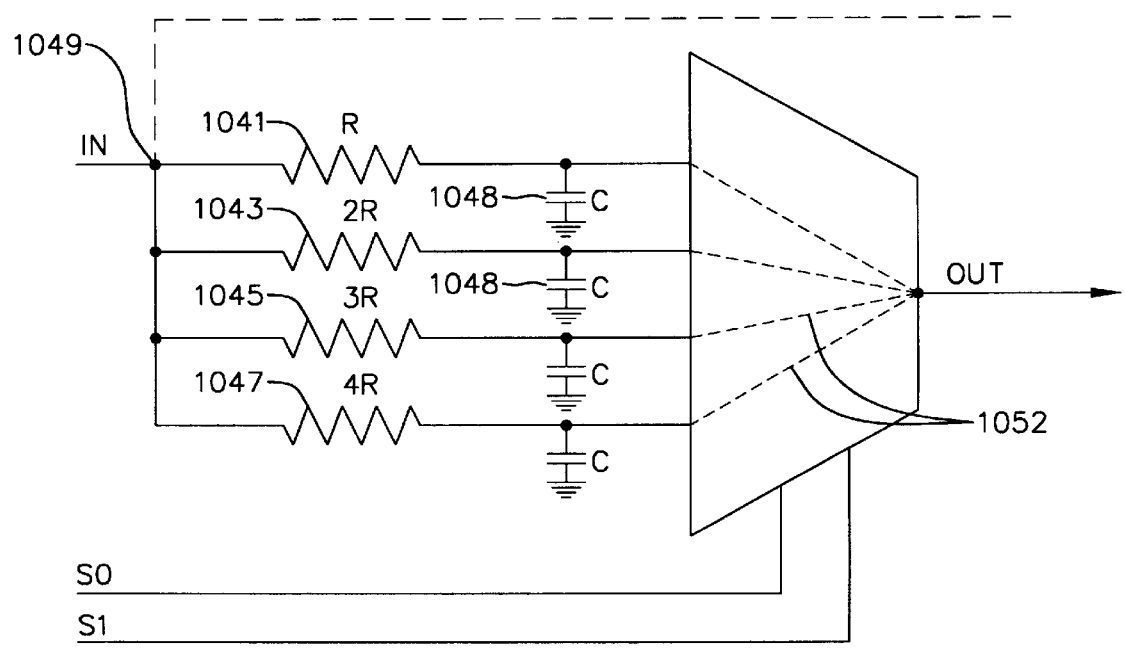
FIG. 14b is a third prior art implementation of a time delay system.

FIGS. 12 and 13 illustrate how a time delayed output signal is generated from an input signal using the time delay system 110 shown in FIG. 3. FIG. 12 illustrates waveforms seen at various nodes of the time delay system 110 when the total selected time delay of the output signal at the node 800 includes a zero step of the medium time delay, a zero step of the fine time delay, and a zero step of the coarse time delay.

In response to the input signal 100a at the input node 100 with the input pulse 100b having its leading edge at X0 and a pulse width of T0, the one-shot unit 200 generates the signal 190a with the pulse 190b having its leading edge at X1, trailing edge at X2, and pulse width of T3. The pulse 190b of the one-shot unit 200 stops the oscillating signal 312a' of the oscillator 300 at X3 after an intrinsic time delay T10 associated with the buffer 310, and re-starts the signal 312a' at X4. The oscillating signal 312a' is stopped for the length of T3, which is the pulse width of the output pulse of the one-shot unit 200. The pulse 190b stops all the other oscillating signals of the oscillator 300 at X3 (not shown).

Since a zero step of the medium time delay is selected, the multiplexer 400 selects the oscillating signal 312a'. An output signal 412a' of the multiplexer 400 is the oscillating signal 312a' delayed by T12 which is an intrinsic time delay associated with the multiplexer 400. With respect to the output of the vernier 700, because a zero step of the fine time delay is selected, an output signal 712a' of the vernier 700 is the output signal 412a' delayed by T14 which is an intrinsic time delay associated with the vernier 700.

Now referring to FIGS. 3, 11, and 12, as to the output signal of the pipeline 500, an output signal 583a at the node 582 in FIG. 11 is produced in response to the output signals of the one-shot unit 200 at the nodes 180 and 190. In FIG. 12, the output signal 582a has a pulse 582b having its leading edge 582c at X9, trailing edge 582d at X10, and a pulse width of T16, as in FIG. 12. The pulse width T16 is the time delay associated with (a) the buffer 530, (b) the multiplexer 540, and (c) the inverter 570, plus the time delay between the SET input and Q output of the flip-flop 520 in FIG. 11. For the signals to propagate properly, X10 must occur before X8, and the pulse width T16 should be smaller than the pulse width T3.

Still referring to FIGS. 3, 11, and 12, since a zero step of the coarse time delay is selected, the flip-flop 650 is set at the arrival of the pulse 582b. Hence, in response to the pulse 582b, an output signal 652a at the node 652 produces a pulse 652b. The pulse 652b has its leading edge 652c at X11 and trailing edge 652d at X12.

The leading edge 652c is produced in response to the leading edge 582c of the pulse 582b. The trailing edge 652d is generated in response to the rising edge of the signal 712a' at X8. The signal 712a' is used as the clock signal of the flip-flops in the shift register 600. The time delay T17, which is X11–X9, is the intrinsic time delay associated with the multiplexer 610 and the time delay between the SET input and Q output of the flip-flop 650. The time delay T19, which is X12–X8, is the time delay between the clock input and Q output of the flip-flop 650. During the clock cycle T20, the pulse 652b is transferred to the output node 800 as an output pulse 800b having a leading edge 800c at X12 and a trailing edge 800d at X14. X12 is X8 delayed by T19. X14 is X13 delayed by T19.

FIG. 13 illustrates waveforms seen at various nodes of the time delay system 110 when the total selected time delay of the output signal at the node 800 includes two steps of the medium time delay, five steps of the fine time delay, and one step of the coarse time delay.

In response to the input signal 100a at the input node 100 with the input pulse 100b having its leading edge at X0 and a pulse width of T0, the one-shot unit 200 generates the signal 190a with the pulse 190b having its leading edge at X1, trailing edge at X2, and pulse width of T3.

The pulse 190b of the one-shot unit 200 stops the oscillating signal 312a' of the oscillator 300 at X3 after an intrinsic time delay T10 associated with the buffer 310, and re-starts the signal 312a' at X4. The pulse 190b also stops all the other oscillating signals including the signal 332a' at X3. However, the oscillating signals re-start at different times. While the signal 312a' re-starts at X4, the signal 332a' re-starts at X20 which is X4 delayed by T30. T30 corresponds to two steps of the medium time delay. Hence, while the oscillating signal 312a' is stopped for the length of T3, the oscillating signal 332a' is stopped for the length of T32, which is the sum of T3-and T30, to provide the two steps of the medium time delay.

Since two steps of the medium time delay are selected, the multiplexer 400 selects the oscillating signal 332a'. An output signal 412a' of the multiplexer 400 is the oscillating signal 332a' delayed by T12 which is an intrinsic time delay associated with the multiplexer 400. With respect to the output of the vernier 700, because five steps of the fine time delay are selected, an output signal 712a'' of the vernier 700 is the output signal 412a'' delayed by T34 which is the sum of (a) T14 which is an intrinsic time delay associated with the vernier 700 and (b) the five steps of the fine time delay.

Now referring to FIGS. 3, 11, and 13, as to the output signal of the pipeline 500, the output signal 582a at the node 582 in FIG. 11 is produced in response to the output signals of the one-shot unit 200 at the nodes 180 and 190. In FIG. 13, the output signal 582a has a pulse 582b having its leading edge 582c at X9, trailing edge 532d X10, and a pulse width of T16, as in FIG. 12. The pulse width T16 is the time delay associated with (a) the buffer 530, (b) the multiplexer 540, and (c) the inverter 570, plus the time delay between the SET input and Q output of the flip-flop 520 in FIG. 11. For the signals to propagate properly, X10 must occur before X28, and the pulse width T16 should be smaller than the pulse width T32.

Still referring to FIGS. 3, 11, and 13, since one step of the coarse time delay is selected, the flip-flop 640 is set at the arrival of the pulse 582b. Hence, in response to the pulse 582b, and output signal 642a at the node 642 produces a pulse 642b. The pulse 642b has its leading edge 642c at X11 and trailing edge 642d at X34.

The leading edge 642c is produced in response to the leading edge 582c of the pulse 582b. The trailing edge 642d is generated in response to the rising edge of the signal 712a'' at X28. The signal 712a'' is used as the clock signal of the flip-flops in the shift register 600. The time delay T17, which is X11–X9, is the intrinsic time delay associated with the multiplexer 610 and the time delay between the SET input and Q output of the flip-flop 640. It is assumed that the flip-flops are identical. The time delay T19, which is X34–X28, is the time delay between the clock input and Q output of the flip-flop 640.

During the clock cycle T40, the pulse 642b is transferred to the node 652 as a pulse 652b' having a leading edge 652c' at X34 and a trailing edge 652d' at X36. During the clock cycle T42, the pulse 652b' is transferred to the output node 800 as a pulse 800b' having a leading edge 800c' at X36 and a trailing edge 800d' at X38.

While the present invention has been particularly described with reference to the various figures and embodiments, it should be understood that these are for illustration only and should not be taken as limiting the scope of the invention. There may be many other ways to implement the time delay system, pulse generator, stop-startable oscillator, fine time delay generator, pipeline unit, and coarse time delay generator of the present invention. Many changes and modifications may be made to the invention, by one having ordinary skill in the art, without departing from the spirit and scope of the invention.

What is claimed is:

1. An apparatus used in generating a delayed output signal from an input signal, comprising:

an oscillator generating an oscillating signal, the oscillator including a substrate, the substrate having a substrate settling time;

a pulse generator coupled to said oscillator, said pulse generator generating a first delayed signal in response to said input signal, the first delayed signal having a leading edge and a trailing edge, said leading edge of said first delayed signal stops oscillating signal and said trailing edge restarts said oscillating signal, with said leading edge and said trailing edge separated in time by less than the substrate settling time.

2. The apparatus of claim 1, wherein said oscillator generates a plurality of oscillating signals that are stopped and re-started by said first delayed signal, said apparatus further comprising:
a phase selector selecting one of said plurality of oscillating signals.

3. The apparatus of claim 2 further comprising:
a vernier coupled to said phase selector, said vernier delaying said selected one of said plurality of oscillating signals.

4. The apparatus of claim 3 further comprising:
a shift register coupled to said pulse generator, said shift register receiving the first delayed signal as a data input and receiving the selected one of said plurality of oscillating signals delayed by the vernier as a clock input, the shift register outputting the delayed output signal.

5. The apparatus of claim 3 wherein the vernier comprises a signal line receiving the selected one of the said plurality of oscillating signals, a plurality of capacitors operably coupled to the signal line by a plurality of switches, each of the plurality of capacitors having an associated switch of the plurality of switches.

6. The apparatus of claim 5 wherein the vernier further comprises decode logic, the decode logic providing signals to control inputs of the plurality of switches.

7. The apparatus of claim 4 further comprising a pipeline, the pipeline passing the first delayed signal from the pulse generator to the shift register, the pipeline delaying the first delayed signal based upon which of the plurality of oscillating signals is selected.

8. An apparatus for generating a delayed output signal from an input signal comprising:
an oscillator generating a plurality of oscillating signals phase-shifted with respect to each other, the plurality of oscillating signals including at least one oscillating signal;
a pulse generator, coupled to said oscillator, said pulse generator generating a first delayed signal having a first time delay in response to said input signal, said first delayed signal stopping and re-starting said at least one oscillating signal,
a phase selector selecting one of said plurality of oscillating signals;
a vernier coupled to said phase selector, said vernier generating multiple steps of a second time delay for said delayed output signal;
a pipeline unit coupled to said pulse generator, said pipeline unit generating a second delayed signal from said first delayed signal; and
a register coupled to said pipeline and vernier, said register generating multiple steps of a third time delay for said delayed output signal, said register for outputting said delayed output signal in response to said second delayed signal and an output signal from said vernier.

9. The apparatus of claim 8, wherein said pipeline unit comprises:
a flip-flop coupled to said pulse generator;
a first buffer coupled to said flip-flop;
a second buffer coupled to said flip-flop;
a third buffer coupled to said second buffer;
a multiplexer coupled to said first and third buffers and to said register; and
an inverter coupled to said flip-flop and multiplexer.

10. The apparatus of claim 8, wherein said register comprises:
a de-multiplexer coupled to said pipeline unit; and
a plurality of flip-flops,
wherein said plurality of flip-flops are connected in series,
wherein all of said plurality of flip-flops except the last one in the series are directly coupled to said de-multiplexer.

11. The apparatus of claim 8, wherein each of the plurality of oscillating signals have substantially the same period and a step of said first time delay is between zero and one half period of the oscillating signals;
wherein a step of said second time delay is equal to or less than said step of said first time delay,
wherein a step of said third time delay is zero or is equal to one period of said oscillating signals, and
wherein a total selected time delay of said delayed output signal includes a sum of said first, second, and third time delays.

12. An apparatus for generating a delayed output signal from an input signal, comprising:
means for generating a plurality of oscillating signals, the plurality of oscillating signals including at least one oscillating signal; and
means for generating a first delayed signal having a first time delay in response to said input signal
wherein said plurality of oscillating signals have substantially the same period and are phase-shifted with respect to each other;
means for selecting one of said plurality of oscillating signals;
means for generating multiple steps of a second time delay for said delayed output signal;
means for generating a second delayed signal from said first delayed signal; and
means for generating multiple steps of a third time delay for said delayed output signal and for outputting said delayed output signal in response to said second delayed signal and an output from said means for generating said multiple steps of said second time delay,
wherein said means for generating said second delayed signal includes means for delivering said second delayed signal to said means for generating said multiple steps of said third time delay at a time appropriate for the amount of said first, second, and third time delays.

13. The apparatus of claim 12, wherein a step of said first time delay is between zero and one half period of said at least one oscillating signal,
wherein a step of said second time delay is equal to or less than said step of said first time delay,
wherein a step of said third time delay is zero or is equal to one period of said at least one oscillating signal, and
wherein a total selected time delay of said delayed output signal includes a sum of said first, second, and third time delays.

14. A method for generating a delayed output signal from an input signal, comprising:
generating a plurality of oscillating signals;
stopping said plurality of oscillating signals in response to a first edge of the input signal;
restarting said plurality of oscillating signals in response to second edge of the input signal;

selecting a one of the plurality of oscillating signals, the one of the plurality of oscillating signals forming a first delayed signal;

delaying the one of the plurality of oscillating signals by a small amount to form a second delayed signal; and delaying the input signal, using the second delayed signal, to form the delayed output signal.

15. The method of claim 14 wherein delaying the input signal, using the second delayed signal, to form the delayed output signal comprises providing the input signal to a shift register the shift register being clocked by the second delayed signal.

16. The method of claim 15 wherein delaying the one of the plurality of oscillating signals by a small amount to form a second delayed signal comprises passing the one of the plurality of oscillating signals through a line coupled to a plurality of incremental capacitors.

* * * * *

UNITED STATES PATENT AND TRADEMARK OFFICE
CERTIFICATE OF CORRECTION

PATENT NO. : 6,229,367 B1
DATED : May 8, 2001
INVENTOR(S) : Ashish K. Choudhury

It is certified that error appears in the above-identified patent and that said Letters Patent is hereby corrected as shown below:

Title page,
Item [63], Related U.S. Application Data, replace "filed on Jun. 27, 1997" with -- filed on Jun. 26. 1997 --.

Column 1,
Line 6, replace "filed on Jun. 27, 1997" with -- filed on Jun. 26, 1997 --.
Line 15, replace "in shown" with -- is shown --.
Line 26, change "time delayed" to -- time delay --.

Column 2,
Line 22, after "time delay" insert -- of --.
Line 28, after "decreases," insert -- and --.

Figure 15A:
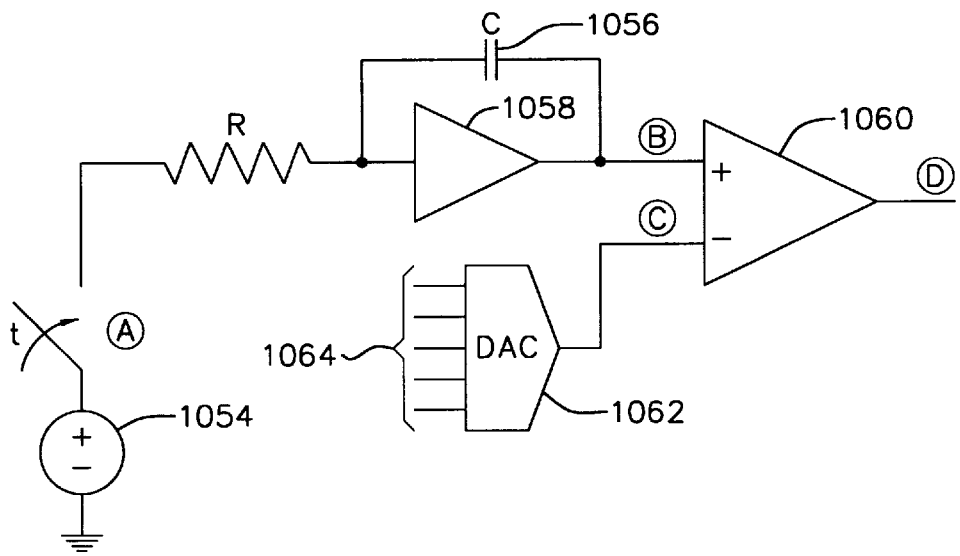
FIG. 15b is a fourth prior art implementation of a time delay system.
Figure 15B:
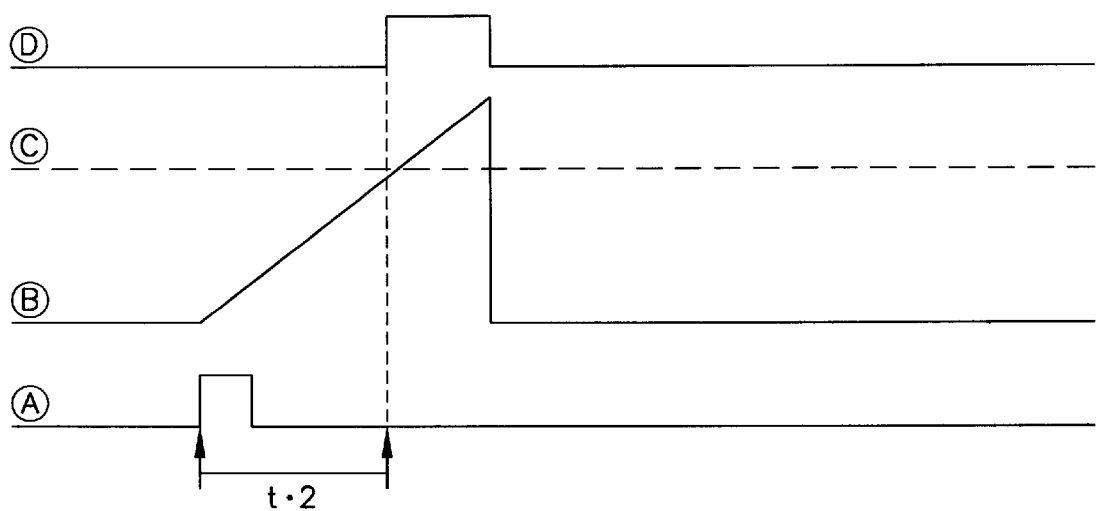

Column 3,
Lines 33-34, replace "in FIG. 4" with -- in FIG. 3 --.
Line 59, replace "FIG. 15b" with -- FIG. 15a --.

Column 4,
Line 10, replace "unnecessary" insert -- unnecessarily --.
Line 48, replace "AS" with -- As --.

Column 6,
Line 15, replace "in 1nS" with -- is 1 nS --.
Line 22, after "time delay" insert -- of --.
Line 43, replace "is" with -- it --.
Lines 50 and 64, replace "setting" with -- settling --.

Column 7,
Line 10, replace "edge 10c" with -- edge 100c --.

Column 8,
Line 1, replace "~–6" with -- ≈–.6 --.

Column 9,
Line 56, replace "in" with -- In --.

Column 11,
Line 6, replace "signal 583a" with -- signal 582a --.
Line 64, replace "signal 412a'" with -- signal 412a'' --.

UNITED STATES PATENT AND TRADEMARK OFFICE
CERTIFICATE OF CORRECTION

PATENT NO.      : 6,229,367 B1
DATED           : May 8, 2001
INVENTOR(S)     : Ashish K. Choudhury It is certified that error appears in the above-identified patent and that said Letters Patent is hereby corrected as shown below:

<u>Column 14,</u>
Line 27, after "input signal" insert -- , wherein the first delayed signal stopping and re-starting the oscillating signals; --.

Signed and Sealed this

Eleventh Day of March, 2003

JAMES E. ROGAN
*Director of the United States Patent and Trademark Office*